United States Patent
Kim et al.

(10) Patent No.: US 9,158,052 B2
(45) Date of Patent: Oct. 13, 2015

(54) METHOD FOR MANUFACTURING A WIRE GRID POLARIZER

(75) Inventors: Jin Su Kim, Seoul (KR); Kyoung Jong Yoo, Seoul (KR); Young-Jae Lee, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 118 days.

(21) Appl. No.: 13/242,802

(22) Filed: Sep. 23, 2011

(65) Prior Publication Data

US 2012/0160802 A1 Jun. 28, 2012

(30) Foreign Application Priority Data

Dec. 27, 2010 (KR) .................. 10-2010-0135677

(51) Int. Cl.
*H01B 13/00* (2006.01)
*G02B 5/30* (2006.01)
*G03F 7/20* (2006.01)

(52) U.S. Cl.
CPC ............... *G02B 5/3058* (2013.01); *G03F 7/20* (2013.01)

(58) Field of Classification Search
CPC ................................ G03F 7/20; G02B 5/3058
USPC ......................................................... 216/13
See application file for complete search history.

(56) References Cited

U.S. PATENT DOCUMENTS

| | | | |
|---|---|---|---|
| 5,976,327 A | 11/1999 | Tanaka | |
| 6,197,167 B1 | 3/2001 | Tanaka | |
| 6,197,181 B1 | 3/2001 | Chen | |
| 6,504,134 B1* | 1/2003 | Sheu et al. | 219/497 |
| 7,692,860 B2 | 4/2010 | Sato et al. | |
| 8,764,996 B2* | 7/2014 | Frey et al. | 216/13 |
| 2007/0019292 A1* | 1/2007 | Kim et al. | 359/486 |
| 2011/0084424 A1* | 4/2011 | Kaida et al. | 264/293 |

FOREIGN PATENT DOCUMENTS

| | | |
|---|---|---|
| EP | 0871218 A2 | 10/1998 |
| EP | 1411377 A1 | 4/2004 |
| KR | 10-2008-0111330 A | 12/2008 |
| KR | 10-2009-0064109 A | 6/2009 |

OTHER PUBLICATIONS

Office Action dated Jan. 21, 2014 in Taiwanese Application No. 10-0137638.

* cited by examiner

*Primary Examiner* — Duy Deo
*Assistant Examiner* — Mahmoud Dahimene
(74) *Attorney, Agent, or Firm* — Saliwanchik, Lloyd & Eisenschenk

(57) ABSTRACT

Provided is a method of manufacturing a wire grid polarizer in which a stable color coordinate can be implemented. According to the present invention, in a process where a second grid pattern of metal pattern is formed over a first grid pattern made of resin material, metal layer is deposited in a concave portion formed between adjacent first grid patterns to form void portion and a width and a height of the second grid pattern are adjusted depending on adjustment of a width of the voids, and thereby improving a process efficiency.

27 Claims, 4 Drawing Sheets

METHOD FOR MANUFACTURING A WIRE GRID POLARIZER

CROSS-REFERENCE TO RELATED APPLICATION

This application claims the benefit under 35 U.S.C. §119 of Korean Patent Application No. 10-2010-0135677, filed on Dec. 27, 2010, which is hereby incorporated by reference in its entirety.

BACKGROUND OF THE INVENTION

1. Field of the Invention

The present invention relates to a method for manufacturing a wire grid polarizer, capable of implementing a stable color coordinate.

2. Description of the Related Art

In general, a polarizer or polarizing device refers to as an optical device for drawing linearly polarized light having a specific vibration direction among non-polarized lights such as natural light. In addition, a wire grid polarizer is a kind of optical devices for producing polarized light using a conductive wire grid.

Generally, in a case where a cycle of metal line placement is shorter than a half-wavelength of an incident electromagnetic wave, a polarized component (s wave) parallel to the metal line is reflected and a polarized component (p wave) vertical to the metal line is transmitted. Here, a planar polarizer having an excellent polarization efficiency, a high transmission rate and a wide view angle cab be manufactured using the phenomenon as described above, which refers to as a wire grid polarizer.

FIG. 1 is a view illustrating a configuration and function of a prior wire grid polarizer wherein metal grids 2 having a predetermined thickness h are placed on a substrate 1 in a predetermined cycle A and the cycle of fine metal grid of a wire grid polarizer may be less than a half of a visible light wavelength. In case where the cycle of a metal line in the wire grid polarizer is much smaller than a wavelength of incident light, when non-polarized light is incident, a component having a vector orthogonal to a conductive wire grid, i.e., p polarized light is transmitted, and a component having a vector parallel to the wire grid, i.e., s polarized light is reflected.

In the prior wire grid polarizer as configured in an above manner, as an incident angle of light is enlarged by a fine metal grid formed directly over a substrate, a transmission rate depending on a wavelength of the incident light is varied, and thereby limiting to implementing colors depending on a view angle. Further, in a case where light is incident from one surface of the substrate 1 opposite to the other surface on which a metal grid is formed, the light is reflected from and absorbed into the one surface of the substrate, and thereby decreasing a light transmission rate.

BRIEF SUMMARY

The present invention has been proposed to solve the above drawbacks and an object of the present invention relates to provide a method for manufacturing a wire grid polarizer. According to the present invention, in a process where a second grid pattern of metal pattern is formed over a first grid pattern made of resin material, metal layer is deposited in a concave portion formed between adjacent first grid patterns to form void portion and a width and a height of the second grid pattern are adjusted depending on adjustment of a width of the void, and thereby improving a process efficiency.

The method for manufacturing a wire grid polarizer according to the present invention comprises a first step of forming a first grid layer provided with a plurality of a first grid patterns on a transparent substrate; a second step of depositing a metal layer to form a void portion on a concave portion of the first grid layer; and a third step of patterning the metal layer to form a second grid pattern on an upper surface of the first grid pattern.

In the second step of manufacturing a wire grid polarizer a width of the void portion is more than 1/100 to less than 1/5 of an interval of the concave portion, enabling to adjust a width and a height of the second grid pattern in a subsequent process.

Further, in the second step of manufacturing a wire grid polarizer a width of the void portion is more than 1/5 to less than 1/2 of an interval of the concave portion, enabling to adjust a width and a height of the second grid pattern in a subsequent process.

In the first step of manufacturing a wire grid polarizer a ratio of width to height of the first grid pattern is 1:0.2-5, a cycle of the first grid pattern is 100-250 nm, a width of the first grid pattern is 10-200 nm, or a height of the first grid pattern is 10-500 nm.

Furthermore, the second step of manufacturing a wire grid polarizer comprises depositing one or alloy of Aluminum, Chrome, Silver, Copper, Nickel and Cobalt.

The third step of manufacturing a wire grid polarizer comprises wet-etching the metal layer to have a width ratio of 1:0.2-1.5 of the first grid pattern and the second grid pattern, and in this case a cycle of the second grid pattern is 100-200 nm, and a width of the second grid pattern is in a range of 2-300 nm.

Meanwhile, a sectional shape of the second grid pattern is one of being rectangular, triangular and semi-circular.

Further, in a method for manufacturing a wire grid polarizer, after the third step a surface treatment process is performed further to the first grid pattern or the third grid pattern, using one of a atmospheric pressure treating, a vacuum plasma treating, a hydrogen peroxide treating, a pro-oxidant treating, a corrosion inhibitor treating, and a self-assembled monolayer (SAM) coating treating.

Additionally, in a method for manufacturing a wire grid polarizer, after the third step a blackening process is performed further to a surface of the second grid pattern using organic substance or inorganic substance.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION

Figure 1:
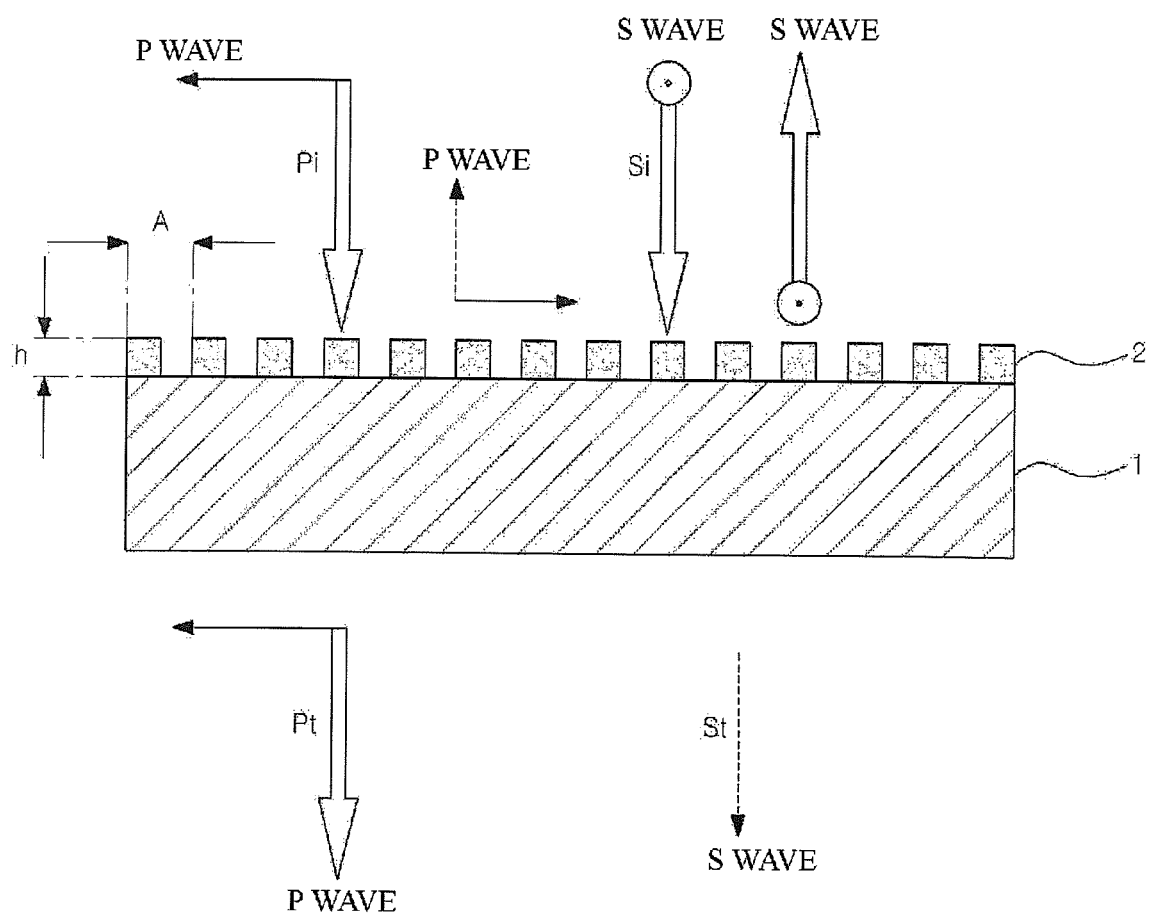
FIG. 1 is a view illustrating a configuration and a function of a prior wire grid polarizer.

Exemplary embodiments of the present invention will be described below in detail with reference to the accompanying drawings to an extent that the present invention may be easily practiced by an ordinary skilled in the art to which the present invention pertains.

While this invention has been particularly shown and described with reference to preferred embodiments thereof, it will be understood by those skilled in the art that various changes in form and details may be made therein without departing from the spirit and scope of the invention as defined by the appended claims.

Wherever possible, the same reference numerals will be used to refer to the same elements throughout the specification, and a duplicated description thereof will be omitted. It will be understood that although the terms "first", "second", etc. are used herein to describe various elements, these elements should not be limited by these terms.

Figure 2:
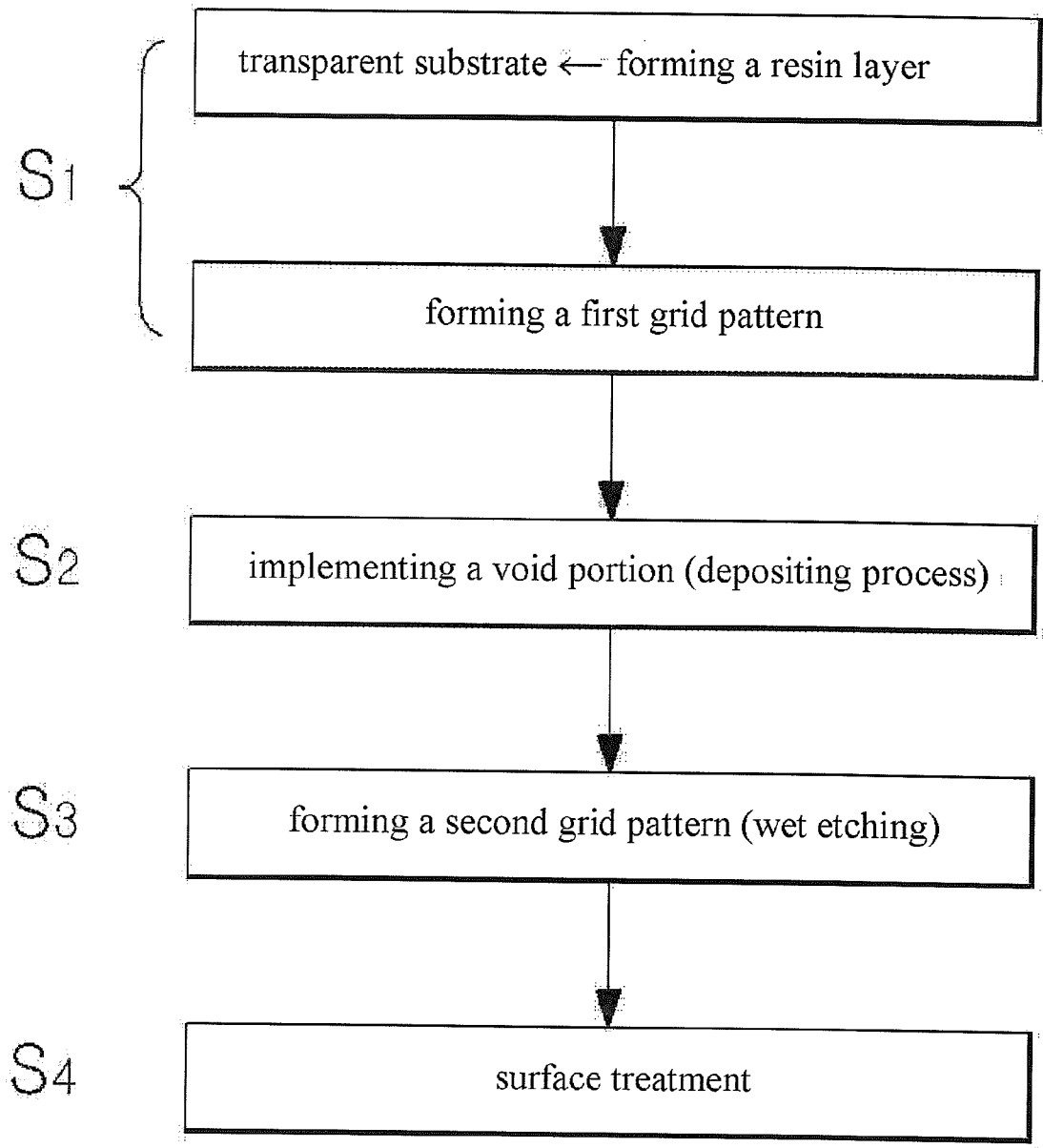
FIGS. 2 and 3 are processes in order of a method for manufacturing a wire grid polarizer and a perspective view illustrating processes of a method for manufacturing a wire grid polarizer, according to one embodiment of the present invention, respectively.
Figure 3:
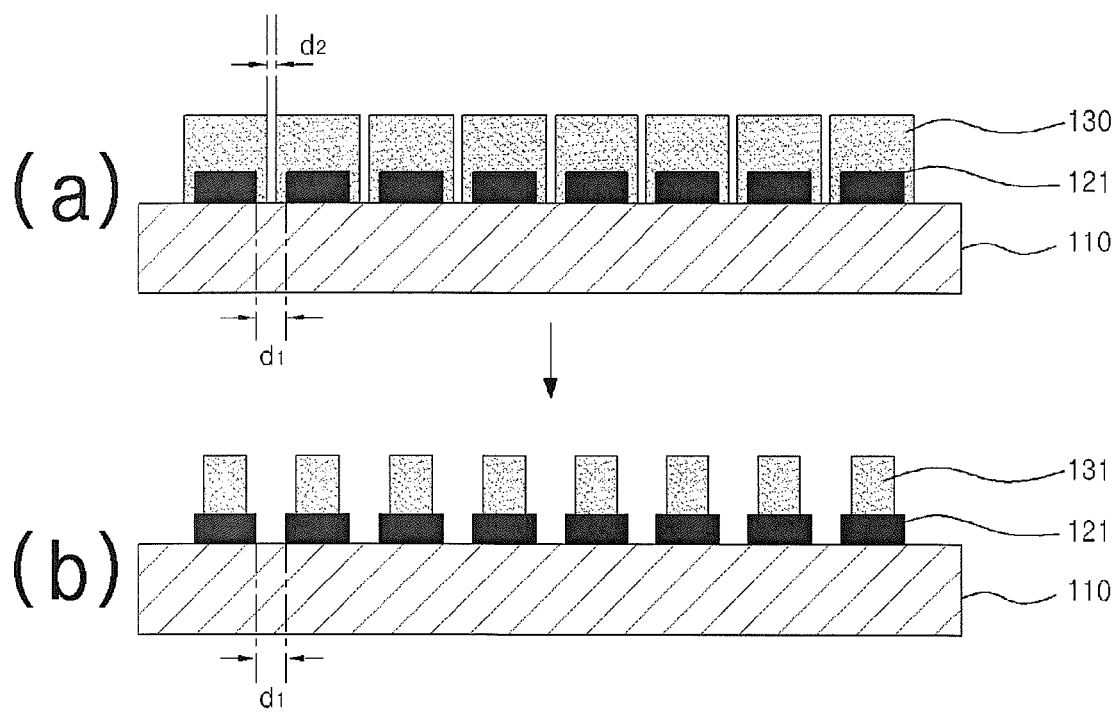

FIGS. 2 and 3 are processes in order of a method for manufacturing a wire grid polarizer and a perspective view illustrating processes of a method for manufacturing a wire grid polarizer, according to one embodiment of the present invention, respectively.

Referring to FIGS. 2 and 3, a method for manufacturing a wire grid polarizer according to the present invention may include a first step S1 of forming a first grid layer provided with a plurality of a first grid patterns on a substrate, a second step S2 of depositing a metal layer to form a void portion in a concave portion of the first grid layer, and a third step S3 of forming a second grid pattern on an upper surface of the first grid pattern by patterning the metal layer, and further may include a fourth step S4 of treating the upper surface of the second grid pattern.

In more detail, referring to FIG. 3($a$), the process is performed by applying resin to form a resin layer on a transparent substrate 110 and patterning the resin layer as a concave portion and a convex portion using a mold. In the present invention, a pattern in a projection shape is defined as a first grid pattern 121 and a whole resin layer on which the first grid pattern 121 is formed is defined as a first grid layer. That is, the first grid layer is defined as including a layer provided with a plurality of the first grid patterns 121 of a projection shape in a predetermined cycle on a surface of the resin layer made of resin.

Here, various high molecular substance including a glass substrate, quartz, acryl, polycarbonate and PET, through which visible light can transmit, may be used for the substrate 110. Specially, in the present invention, a film base material for optics, having a predetermined flexibility, may be processed through a continuous process.

The first grid layer may be formed adherently on an upper surface of the substrate 110 as a resin layer of polymer, on a surface of which a plurality of first grid patterns 121 in a projection shape may be provided.

Next, a process of depositing a metal layer 130 on the first grid layer and the first grid pattern 121 may be performed using one or alloy of Aluminum, Chrome, Silver, Copper, Nickel and Cobalt wherein a void portion may be formed in a concave portion of the first grid layer. The void portion refers to as a space having a distance $d_2$ formed on the concave portion between one first grid pattern and another adjacent first grid pattern while depositing the metal layer.

In subsequence, as shown in FIG. 3($b$), a second grid pattern 131 may be formed by a wet etching process through the void portion $d_2$ as a media. That is, in the present invention, a height and a width of the second grid pattern may be controlled by adjusting a size of a void.

In more detail, the void portion $d_2$ may be formed in a size of more than $\frac{1}{100}$-less than $\frac{1}{5}$ of an interval $d_1$ of the concave portion, and thus in subsequent etching process etching may be performed through the void portion and thereby forming widely a width of the second grid pattern. Further, differently from this configuration, the void portion $d_2$ may be formed in a size of more than $\frac{1}{5}$-less than $\frac{1}{2}$ of an interval $d_1$ of the concave portion, and the metal layer is wet-etched and thereby forming widely a width and highly a height of the second grid pattern 131.

Figure 4:
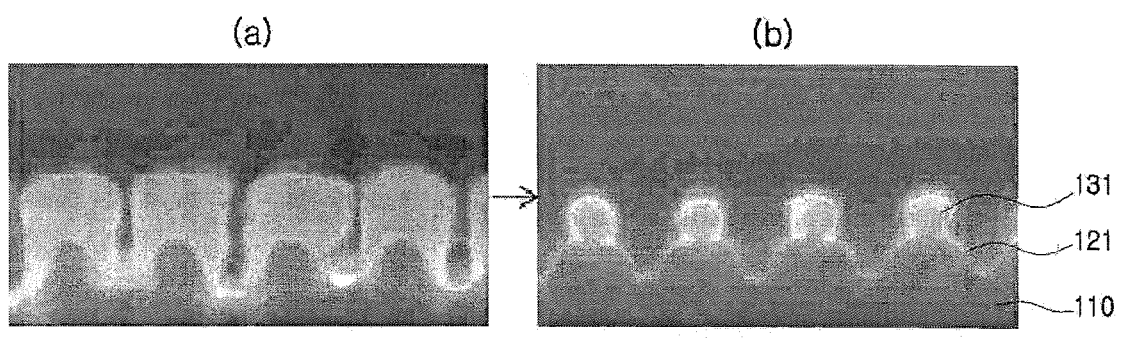
FIGS. 4-6 are real images of the wire grid polarizer manufactured according to the present invention.
Figure 5:
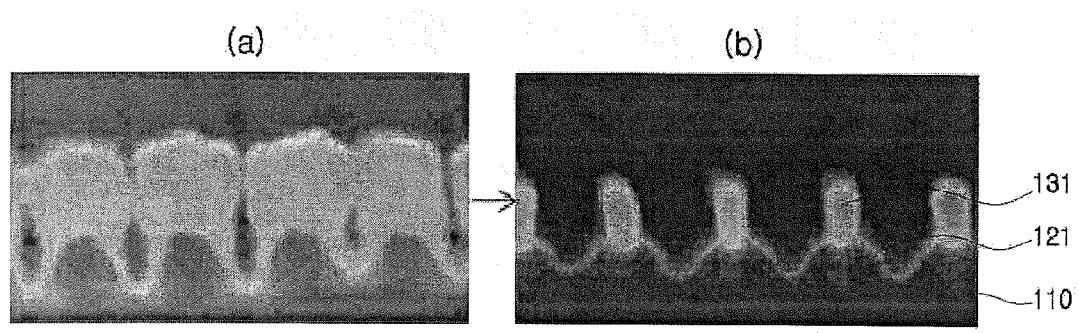
Figure 6:
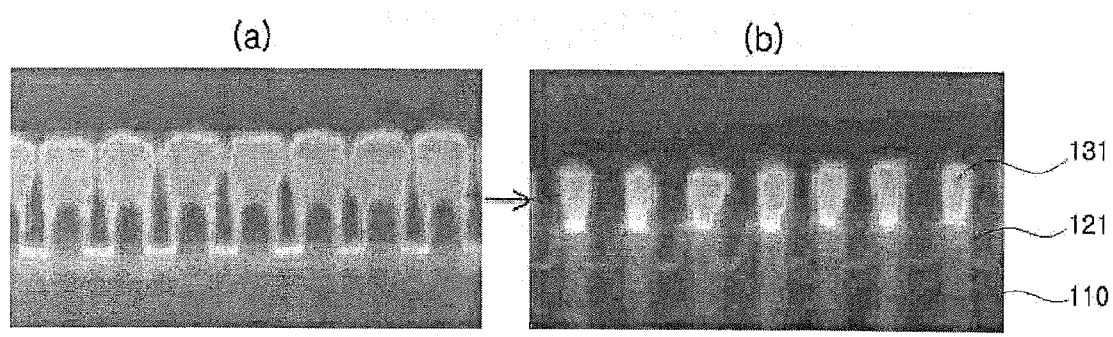

FIGS. 4 ($a$) and ($b$) are real images of the void portions formed between one metal layer and another adjacent metal layer to form a second grid pattern, FIGS. 5 ($a$) and ($b$) are real images of the void portion to form the second grid pattern wherein a width of the void portion is more than $\frac{1}{5}$ to less than $\frac{1}{2}$ of an interval $d_1$ of the concave portion, and FIGS. 6 ($a$) and ($b$) are real images of the void portion to form the second grid pattern wherein a width of the void portion $d_2$ is more than $\frac{1}{100}$ to less than $\frac{1}{5}$ of the interval $d_1$ of the concave portion. The adjustments of a height and a width of the second grid pattern through this adjustment of the width of the void portion has been done in a consideration that transmission rates through the wire grid polarizer can be controlled depending on heights and widths of two grid patterns (first and second grid patterns) of the wire grid polarizer according to the present invention. That is, as a grid width widens in a same pitch, the transmission rate may be lowered and depolarization rate is increased wherein a polarization characteristics increases as a pitch decreases in order to ensure a maximum polarization efficiency, and in a case where the pitch is formed as a distance between the same grids and a width of the same grid, the polarization characteristics increases as a grid height increases, and in a case where the pitch is formed as a distance between the same grids and a height of the same grid, the polarization characteristics is improved as a grid width increases. Accordingly, a width of the first grid pattern may be adjusted to being 0.2-1.5 times wider than a width of the second grid pattern.

As a result, the width of the first grid pattern of the wire grid polarizer according to the present invention may be 10-200 nm, a height thereof may be 10-500 nm and a cycle of the first grid pattern may be 100-250 nm wherein a mold pattern may be configured, corresponding the values of the first grid pattern. Specially, a ratio of width to height of the first grid pattern may be 1:0.2-5.

Furthermore, a sectional shape of the second grid pattern 131 may be rectangular, triangular, and semi-circular and further be a metal line shape formed a portion of substrate patterned as a triangular shape, a rectangular shape or a sign wave. That is, regardless of the sectional shape any metal lines extended in a length way of one direction, having a predetermined cycle may be employed as the second grid pattern. In this case, the cycle may be less than a half of a wavelength of employed light and thus the cycle may be 100-400 nm, more preferably be 100-200 nm. Further, in a preferable embodiment of the present invention, a ratio of width to height of the second grid pattern 131 may be 1:0.5-1.5.

Figure 7:
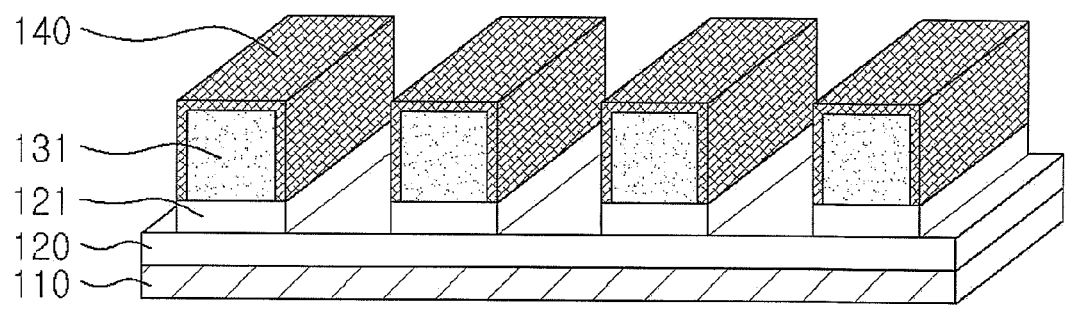
FIG. 7 is a perspective view illustrating a configuration of a wire grid polarizer according to another embodiment of the present invention.

FIG. 7 is a view illustrating a configuration of a preferred embodiment of the present invention. In the configuration as shown in FIG. 7, a first grid layer 120 made of resin to be laminated on a transparent substrate 110 is provided and a first grid pattern 121 is provided on the first grid layer. There is difference of the grid pattern configuration as shown in FIG. 3; however, it is same configuration as shown in FIG. 3 in that the first grid pattern and the second grid pattern are provided directly on the transparent substrate 110. Specially, in the present embodiment, a surface treatment layer 140 may be provided on the first grid pattern and the second grid pattern, which may be formed by separately treating surfaces.

Here, according to a method of manufacturing a wire grid polarizer, the surface treatment process may be performed further on the first grid pattern and the second grid pattern, including one of a atmospheric pressure treating, a vacuum plasma treating, a hydrogen peroxide treating, a pro-oxidant treating, a corrosion inhibitor treating, and a self-assembled monolayer (SAM) coating treating.

In this case, as shown in FIG. 7, a surface treatment layer 140 may be provided on the first grid pattern 121 and the second grid pattern 131 wherein the surface treatment layer may be formed to improve durability and strength, using one of a atmospheric pressure treating, a vacuum plasma treating, a hydrogen peroxide treating, a pro-oxidant treating, a corrosion inhibitor treating, and a self-assembled monolayer coating treating.

Specially, as shown in FIG. 7, in a case where the surface treatment layer 140 is formed to surround a whole second grid pattern 131 and an adhering portion of the first grid pattern 121 and the second grid pattern 131, an oxidation film or similar surface treatment film for improving durability, without varying surfaces of respective grid patterns, may be provided to improve an adhering force of physical characteristics between the first grid pattern and the second grid pattern, without degrading optical characteristics.

Additionally, a surface of the second grid pattern 131 may be blackened. The blackened layer may be formed basically on a portion of or the whole second grid pattern 131 using organic material or inorganic material. That is, it is configured in such manner that a portion of or whole second grid pattern may be formed as the blackened layer.

In more detail, the blackening process according to the preferred embodiment of the present invention is performed by forming a cover film for a surface of the second grid pattern 131 using organic substance or inorganic substance wherein a surface reflection rate of a substrate is less than 40%.

As the organic substance for blackening the second grid pattern, a substance comprising chrome oxide or carbon may be used, and further copper may be performed through an oxidation process as inorganic substance. That is, in a case of the inorganic substance, copper may be deposited over a metal grid pattern and be etched to form a portion of or the whole metal grid pattern and then dry or wet metal oxidation (blackening) process may be performed to blacken the copper. Further, chrome may be deposited over the metal grid pattern and be etched to form a portion of or the whole metal grid pattern and then blackening process may be performed. This blackened layer may lower greatly a surface re-reflection rate of the light incident outside and increase a contrast improvement range, and further improve readability. Of course, differently from this configuration, a protection layer made of oxidation layer or polymer resin may be provided on an upper surface of the second grid pattern 131 to protect the second grid pattern 131 of a metal pattern.

According to the present invention, in a process where a second grid pattern of metal pattern is formed over a first grid pattern made of resin material, metal layer is deposited in a concave portion formed between adjacent first grid patterns to form void portion and a width and a height of the second grid pattern are adjusted depending on adjustment of a width of the voids, and thereby improving a process efficiency.

Specially, a metal grid pattern (second grid pattern) and a first grid pattern disposed under the metal grid pattern may be formed depending on a width adjustment of a void, and thus transmission rate of respective wavelengths is controlled depending on incident angle of incident light, and thereby minimizing color variations depending on view angles.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A method of manufacturing a wire grid polarizer, comprising:
   providing a transparent substrate;
   depositing a resin layer on the transparent substrate;
   patterning the resin layer to form a first grid layer comprising a plurality of first grid patterns on the transparent substrate and a concave portion between the first grid patterns, wherein each first grid pattern has an upper surface and a side surface;
   depositing a metal layer on the first grid patterns and the concave portion in such a manner that a void portion is present on the concave portion after the metal layer is deposited, thereby enabling a separation space having a regular interval to be formed between one portion of the metal layer and another portion of the metal layer deposited on an adjacent first grid pattern; and
   performing a wet etching process to pattern the metal layer deposited on the first grid patterns and the concave portion to remove any of the metal layer present on the side surface of each first grid pattern and to respectively form second grid patterns on the upper surfaces of the first grid patterns;
   wherein a portion of the transparent substrate is exposed between the first grid patterns.

2. The method of manufacturing a wire grid polarizer of claim 1, wherein in the depositing a metal layer, a width of the void portion is more than $1/100$ to less than $1/5$ of an interval of the concave portion.

3. The method of manufacturing a wire grid polarizer of claim 1, wherein in the depositing a metal layer, a width of the void portion is more than $1/5$ to less than $1/2$ of an interval of the concave portion.

4. The method of manufacturing a wire grid polarizer of claim 2, wherein in the forming a first grid layer, a ratio of width to height of the first grid pattern is 1:0.2-5.

5. The method of manufacturing a wire grid polarizer of claim 4, wherein in the forming a first grid layer, a cycle of the first grid pattern is 100-250 nm.

6. The method of manufacturing a wire grid polarizer of claim 5, wherein in the forming a first grid layer, a width of the first grid pattern is 10-200 nm.

7. The method of manufacturing a wire grid polarizer of claim 6, wherein in the forming a first grid layer, a height of the first grid pattern is 10-500 nm.

8. The method of manufacturing a wire grid polarizer of claim 4, wherein the depositing a metal layer comprises depositing one or alloy of Aluminum, Chrome, Silver, Copper, Nickel and Cobalt.

9. The method of manufacturing a wire grid polarizer of claim 8, wherein the patterning the metal layer comprises wet-etching the metal layer to have a width ratio of 1:0.2-1.5 of the first grid pattern and the second grid pattern.

10. The method of manufacturing a wire grid polarizer of claim 8, wherein in the patterning the metal layer, a ratio of width to height of the second grid pattern is 1:0.5-1.5.

11. The method of manufacturing a wire grid polarizer of claim 10, wherein in the patterning the metal layer, a cycle of the second grid pattern is 100-200 nm.

12. The method of manufacturing a wire grid polarizer of claim 10, wherein in the patterning the metal layer, a width of the second grid pattern is in a range of 2-300 nm.

13. The method of manufacturing a wire grid polarizer of claim 10, wherein a sectional shape of the second grid pattern is one of rectangular, triangular and semi-circular.

14. The method of manufacturing a wire grid polarizer of claim 9, wherein after the patterning the metal layer, a surface treatment process is performed further to the first grid pattern or the second grid pattern, using one of an atmospheric pressure treating, a vacuum plasma treating, a hydrogen peroxide treating, a pro-oxidant treating, a corrosion inhibitor treating, and a self-assembled monolayer (SAM) coating treating.

15. The method of manufacturing a wire grid polarizer of claim 9, wherein after the patterning the metal layer, a blackening process is performed further to a surface of the second grid pattern using an organic substance or inorganic substance.

16. The method of manufacturing a wire grid polarizer of claim 3, wherein in the forming a first grid layer, a ratio of width to height of the first grid pattern is 1:0.2-5.

17. The method of manufacturing a wire grid polarizer of claim 16, wherein in the forming a first grid layer, a cycle of the first grid pattern is 100-250 nm.

18. The method of manufacturing a wire grid polarizer of claim 17, wherein in the forming a first grid layer, a width of the first grid pattern is 10-200 nm.

19. The method of manufacturing a wire grid polarizer of claim 18, wherein in the forming a first grid layer, a height of the first grid pattern is 10-500 nm.

20. The method of manufacturing a wire grid polarizer of claim 16, wherein the depositing a metal layer comprises depositing one or alloy of Aluminum, Chrome, Silver, Copper, Nickel and Cobalt.

21. The method of manufacturing a wire grid polarizer of claim 20, wherein the patterning the metal layer comprises wet-etching the metal layer to have a width ratio of 1:0.2-1.5 of the first grid pattern and the second grid pattern.

22. The method of manufacturing a wire grid polarizer of claim 20, wherein in the patterning the metal layer, a ratio of width to height of the second grid pattern is 1:0.5-1.5.

23. The method of manufacturing a wire grid polarizer of claim 22, wherein in the patterning the metal layer, a cycle of the second grid pattern is 100-200 nm.

24. The method of manufacturing a wire grid polarizer of claim 22, wherein in the patterning the metal layer, a width of the second grid pattern is in a range of 2-300 nm.

25. The method of manufacturing a wire grid polarizer of claim 22, wherein a sectional shape of the second grid pattern is one of rectangular, triangular and semi-circular.

26. The method of manufacturing a wire grid polarizer of claim 21, wherein after the patterning the metal layer, a surface treatment process is performed further to the first grid pattern or the second grid pattern, using one of an atmospheric pressure treating, a vacuum plasma treating, a hydrogen peroxide treating, a pro-oxidant treating, a corrosion inhibitor treating, and a self-assembled monolayer (SAM) coating treating.

27. The method of manufacturing a wire grid polarizer of claim 21, wherein after the patterning the metal layer, a blackening process is performed further to a surface of the second grid pattern using an organic substance or inorganic substance.

* * * * *